(12) United States Patent
Nakano et al.

(10) Patent No.: US 6,349,670 B1
(45) Date of Patent: Feb. 26, 2002

(54) PLASMA TREATMENT EQUIPMENT

(75) Inventors: Akira Nakano; Koichi Fukuda, both of Miyagi-ken; Sung Chul Kim, Kyongki-Do; Yasuhiko Kasama, Miyagi-ken; Tadahiro Ohmi, Miyagi-ken; Shoichi Ono, Miyagi-ken, all of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/442,539

(22) Filed: Nov. 18, 1999

(30) Foreign Application Priority Data

Nov. 30, 1998 (JP) .............................................. 10-340806

(51) Int. Cl.[7] .............................................. C23C 16/00
(52) U.S. Cl. .................................... 118/723 E; 156/345
(58) Field of Search ........................ 118/723 E, 723 ER, 118/723 R, 728, 723 MW, 723 MA, 723 ME, 723 MR, 723 I, 723 IR, 723 AN; 156/345

(56) References Cited

U.S. PATENT DOCUMENTS 5,472,561 A    12/1995   Williams et al.
5,942,039 A * 8/1999   Kholodenko et al. .... 118/723 E
6,051,100 A * 4/2000   Walko, II .................... 156/345

* cited by examiner

Primary Examiner—Gregory Mills
Assistant Examiner—Luz Alejandro
(74) Attorney, Agent, or Firm—Brinks Hofer Gilson & Lione

(57) ABSTRACT

The invention provides a plasma equipment which is advantageous in that the suscepter impedance is small, the dependence on the frequency is low, the power consumption efficiency is high, the film forming speed is faster as compared with conventional plasma equipment, and the film quality is high. Metal plates AC short between a chamber wall and a shield of an electrode of the same DC potential as the chamber.

12 Claims, 20 Drawing Sheets

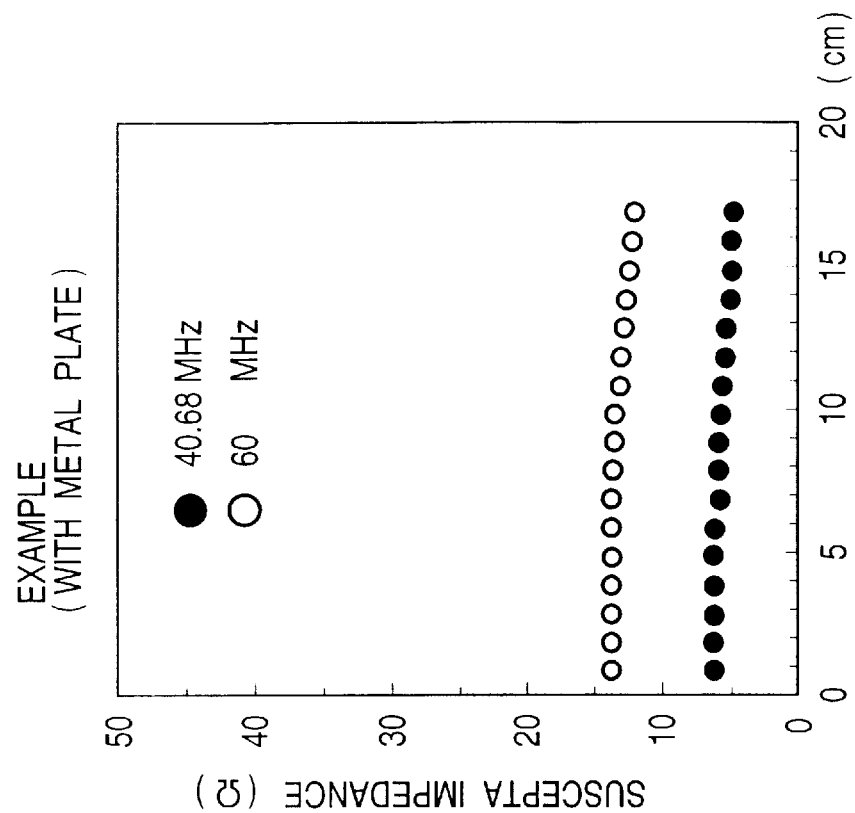
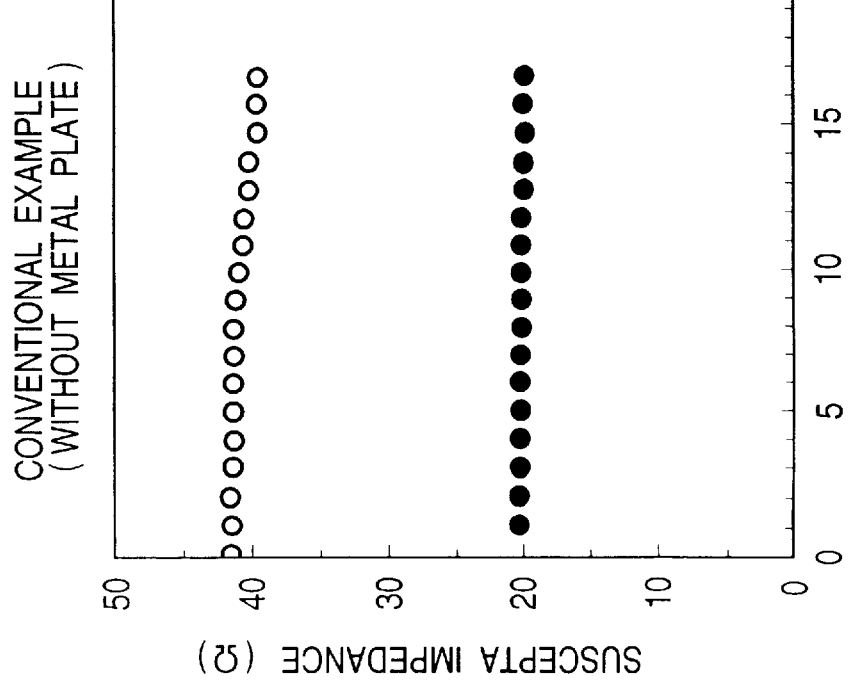

CONVENTIONAL EXAMPLE

EXAMPLE

FIG. 20
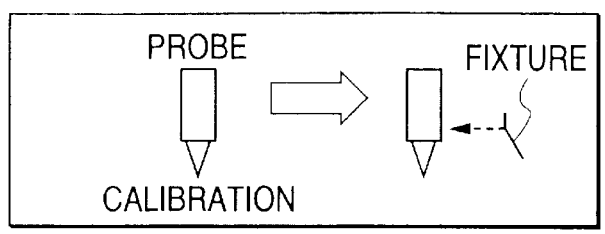
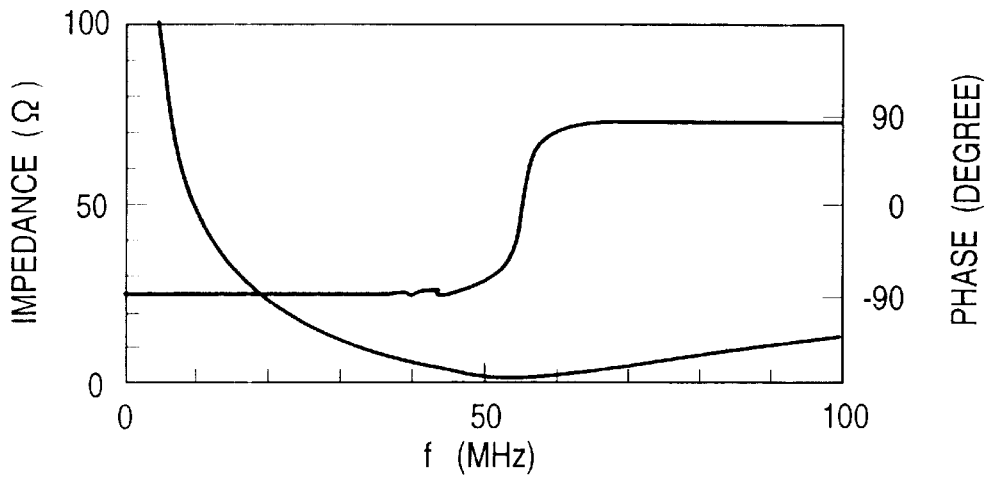
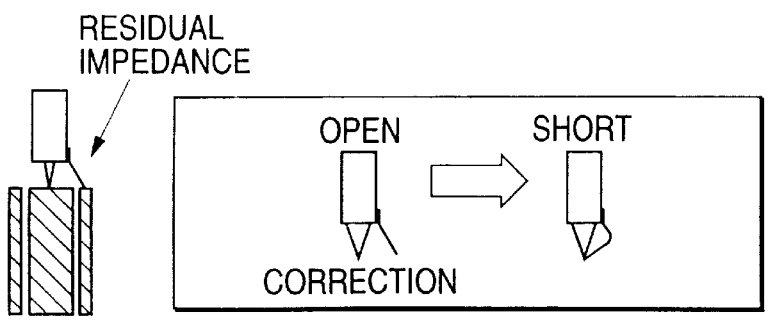
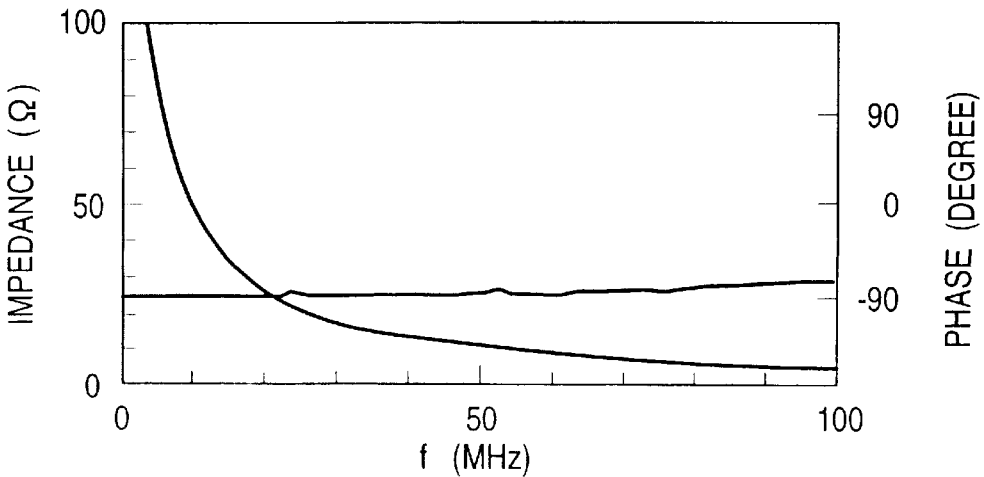

PLASMA TREATMENT EQUIPMENT

BACKGROUND OF THE INVENTION

1. Field of the Invention

The present invention relates to plasma treatment equipment.

2. Description of Related Art

Plasma treatment equipment shown in FIG. 12 has been known heretofore as plasma treatment equipment.

In the plasma treatment equipment, a matching circuit is provided between a high frequency power source 1 and a plasma excitation electrode 4. The matching circuit is a circuit for matching the impedance between these high frequency power source 1 and the plasma excitation electrode 4.

The high frequency power is supplied from the high frequency power source 1 to the plasma excitation electrode 4 by way of a matching circuit and through a feeder plate 3.

These matching circuit and feeder plate 3 are contained in a matching box 2 formed of a housing 21 consisting of conductive material.

A shower plate 5 having a number of holes 7 is provided under the plasma excitation electrode (cathode) 4, and a space 6 is defined by the plasma excitation electrode 4 and the shower plate 5. A gas guide pipe 17 is provided to the space 6. Gas introduced from the gas guide pipe 17 is supplied to a chamber 60 defined by a chamber wall 10 through the holes 7 of the shower plate 5. 9 denotes an insulator for insulation between the chamber wall 10 and the plasma excitation electrode (cathode) 4. An exhaust system is omitted in this drawing.

On the other hand, in the chamber 60, a wafer susceptor (susceptor electrode) 8 serves as a plasma excitation electrode having a base plate 16 placed thereon is provided, and a susceptor shield 12 is provided on the periphery of the wafer susceptor 8. The wafer susceptor 8 and susceptor shield 12 are vertically movable by means of a bellows 11 so that the distance between the plasma excitation electrodes 4 and 8 is adjustable.

The second high frequency power source 15 is connected to the wafer susceptor 8 through the matching circuit contained in a matching box 14. The DC potential of the chamber is the same as that of the susceptor shield 12.

Another conventional plasma treatment equipment is shown in FIG. 14.

The plasma treatment equipment shown in FIG. 12 is a so-called double wave excitation type plasma treatment equipment, whereas, the plasma treatment equipment shown in FIG. 14 is a single wave excitation type plasma treatment equipment. As shown in FIG. 14, the high frequency power is supplied only to the cathode 4 and the susceptor electrode 8 is grounded. Unlike the plasma treatment equipment shown in FIG. 12, there is no high frequency power source 15 and no matching box 14. The DC potential of the susceptor electrode 8 is the same as that of the chamber wall 10.

Yet another conventional plasma treatment equipment is shown in FIG. 15. There is no shower plate in the plasma treatment equipment shown in FIG. 15, and the cathode 4, which serves as a plasma excitation electrode, is disposed so as to face directly to the wafer susceptor 8. A shield 20 is provided on back side periphery of the cathode 4. This plasma treatment equipment has the same structure as that shown in FIG. 12 excepting the above-mentioned points.

Further another conventional plasma treatment equipment is shown in FIG. 16. The plasma treatment equipment shown in FIG. 15 is a so-called double wave excitation type plasma treatment equipment, whereas, the plasma treatment equipment shown in FIG. 16 is a single wave excitation type plasma treatment equipment. As shown in FIG. 16, the high frequency power is supplied only to the cathode 4, and the susceptor electrode 8 is grounded. There is no high frequency power source 15 and no matching box 14 (like that shown in FIG. 15). The DC potential of the susceptor electrode 8 is the same as that of the chamber wall 10.

However, it is found as the result of detailed study of the conventional plasma treatment equipment that the power consumption efficiency (proportion of the power consumed in plasma to the power supplied to a plasma excitation electrode 4) is not necessarily high, and particularly the power consumption efficiency decreases remarkably as the frequency supplied from a high frequency power source increases. Also it is found by the inventors of the present invention that the decrease in efficiency becomes more remarkable as the base plate size increases.

In conventional plasma treatment equipment shown in FIG. 12, FIG. 14, FIG. 15, and FIG. 16, the susceptor impedance (impedance between the susceptor and chamber) is high, and the impedance increases more as the frequency of high frequency power supplied from the high frequency power source 1 or 15 increases. In other words, the impedance depends on the frequency. As a result, the high frequency current of the plasma, which is connected to the susceptor impedance, decreases and the power consumption efficiency decreases remarkably as the frequency of high frequency power supplied from the high frequency power source 1 increases.

The power consumption efficiency is checked by a method as described herein under.

(1) The chamber wall of plasma treatment equipment is replaced with an equivalent circuit comprising a concentrated constant circuit.

(2) Constants of circuits are determined by measuring the impedance of chamber components using an impedance analyzer.

(3) The impedance of the whole chamber during discharge is measured by utilizing the relation that the impedance of the whole chamber during discharge is in complex conjugate to the impedance of the matching box provided with a 50 Ω dummy load on the input side.

(4) The plasma space is regarded as a series circuit of a resistance R and capacitance C, and constants are calculated from values obtained in (2) and (3).

(5) Based on the equivalent circuit model of the chamber during discharge obtained by means of the above-mentioned method, the circuit calculation is performed and the power consumption efficiency is derived.

As described herein above, the conventional plasma treatment equipment is disadvantageous in that the film forming speed is low due to low power consumption efficiency and it is difficult to form an insulating film with high dielectric strength when a insulating film is formed.

The inventors of the present invention have studied the cause of low power consumption efficiency. As the result, the cause of the low power consumption efficiency described herein under has been found.

In detail, first, in the susceptor electrode 8 side of the conventional plasma treatment equipment shown in FIG. 12, as shown by an arrow shown in FIG. 13 which is an enlarged view of the suscepter electrode 8 shown in FIG. 12, the high frequency power is supplied from the high frequency power source 1 to a coaxial cable, the matching circuit, the feeder plate 3, and the plasma excitation electrode (cathode) 4. On the other hand, in the case that the path of the high frequency current is addressed, the current passes the plasma space (chamber 60) through these components, and the other electrode (suscepter electrode) 8, the vertical part of shield 12, the bellows 11, the bottom 10*b* of the chamber wall 10 and the sidewall 10*s* of the chamber wall 10. Then, the current passes the housing of the matching box 2 and returns to the earth of the high frequency power source 1.

In the plasma treatment equipment shown in FIG. 14, the high frequency power from the high frequency power source 1 is supplied through the coaxial cable, the matching circuit, and the feeder plate 3 and to the cathode 4. On the other hand, in the case that the path of the high frequency current is addressed, the current passes to the plasma space through these components, further to the other electrode (suscepter electrode) 8, the shaft 13, the bottom 10*b* of the chamber wall 10, and the side wall 10*s* of the chamber wall 10. Then, the current passes through the housing of the matching box 2 and returns to the earth of the high frequency power source 1.

However, in the conventional plasma treatment equipment shown in FIG. 12 and FIG. 14, the going current though the vertical part of the shield 12 and the returning current through the chamber side wall 10*s* are in parallel relation because the shaft 13 (or the vertical part of the shield 12 of the suscepter electrode 8) is parallel to the chamber side wall 10*s*, and the parallel relation results in increased mutual inductance. As the result, the power consumption efficiency is decreased, and the film forming speed is reduced or the film quality is deteriorated. The influence of the mutual inductance is larger as the base plate 16 is larger and consequently as the distance between the feeder plate 3 and the housing of the matching box 2 is larger, and particularly the influence is remarkable in the case of the base plate size of 80 to 100 cm.

Such finding associated with the above-mentioned problem was found first by the inventors of the present invention.

SUMMARY OF THE INVENTION

The present invention was accomplished to solve the above-mentioned problem and it is the object of the present invention to provides plasma treatment equipment having a small susceptance impedance with low frequency dependency and high power consumption efficiency which is capable of forming a film of excellent quality at a film forming speed higher than that of the conventional plasma treatment equipment.

Plasma treatment equipment of the present invention is characteristic in that a chamber wall and an electrode of the same DC potential as the chamber are AC shorted.

Such shorting structure allows a high frequency current to pass the shorted part where the mutual inductance with the chamber wall is smaller than the vertical part of the electrode. The mutual inductance of the high frequency current path is reduced and the consumption efficiency of the high frequency power supplied to the path is significantly improved.

It is necessary that the above-mentioned shorted part is located as near as possible to the chamber wall in order to reduce the mutual inductance effectively, the shorted part is located desirably within a length of 500 mm from the chamber wall side in horizontal direction.

Furthermore, the chamber side shorted part is located desirably within a length of 500 mm from the chamber side wall in the horizontal direction from the same view point described herein above.

In order to reduce the high frequency resistance of the path of the high frequency current through the above-mentioned shorted part to reduce the power loss by the shorted part, the above mentioned shorted part comprises a plurality of shorted parts.

Plasma treatment equipment of the present invention is characteristic in that a chamber wall and a shield of an electrode of the same DC potential as the chamber are AC shorted. The above-mentioned shorted part is desirably disposed so that the short point is located approximately at point symmetrically with respect to the center of the electrode, and thereby the path where the high frequency current flows is uniformed and plasma treatment effect is distributed uniformly on an object to be treated which is located at the center of the electrode.

The above-mentioned shorted part is desirably disposed so that the short point is located approximately at point symmetrically with respect to the center of the shield, and thereby the path where the high frequency current flows is uniformed and plasma treatment effect is distributed uniformly on an object to be treated which is located at the center of the electrode.

The present invention provides a novel impedance measurement tool. The impedance measurement tool is provided with a probe comprising a conductor, an insulating sheath coated on the conductor, and a peripheral conductor coated on the insulating sheath, and a testing tool comprising a plurality of lead wires electrically connected to the peripheral conductor of the probe and disposed radially from the center of the probe and detachable terminals provided on the free ends of the respective lead wires for detaching from the object to be measured, wherein the impedance of all series components from the probe to the detachable terminal through the lead wire are equalized each other.

By using the measurement tool having the above-mentioned structure, the impedance which will be during plasma treatment is measured correctly without restriction on the distance between two points to be measured though the object to be measured is large.

A plurality of lead wires are connected to a plurality of points of an object to be measured respectively to reduce the impedance of the above-mentioned testing tool. As the result, the proportion of the impedance of an object to be measure to the impedance of the whole measurement system including the object to be measured becomes high, and the impedance is measured at higher accuracy.

The impedance measurement tool of the present invention may have the above-mentioned testing tool which is attached to the probe so as to be detachable from the probe with interposition of a probe attachment to which the other respective ends of the plurality of lead wires are electrically connected.

In the case of the structure as described herein above, various testing tools have been prepared previously, the impedance of various objects to be measured with various sizes and various configuration are measured by use of the same probe with changing a testing tool depending on the object to be measured.

The above-mentioned plurality of lead wires are desirably connected electrically to each other at the midway of the respective lead wires with another lead wire.

The number of paths of the measurement current is increased by employing the structure described herein above, and the impedance of the above-mentioned testing tool is reduced. As the result, the proportion of the impedance of an object to be measure to the impedance of the whole measurement system including the object to be measured becomes high, and the impedance is measured at higher accuracy.

BRIEF DESCRIPTION OF THE DRAWINGS

FIGS. 4A and 4B are graphs for showing the measurement result in accordance with the first embodiment of the plasma treatment equipment and a conventional example.

FIG. 20 is a graph for showing the result measured by use of the impedance measurement tool shown in FIG. 17.

DETAILED DESCRIPTION OF THE PREFERRED EMBODIMENTS

First Embodiment of Plasma Treatment Equipment

Figure 1:
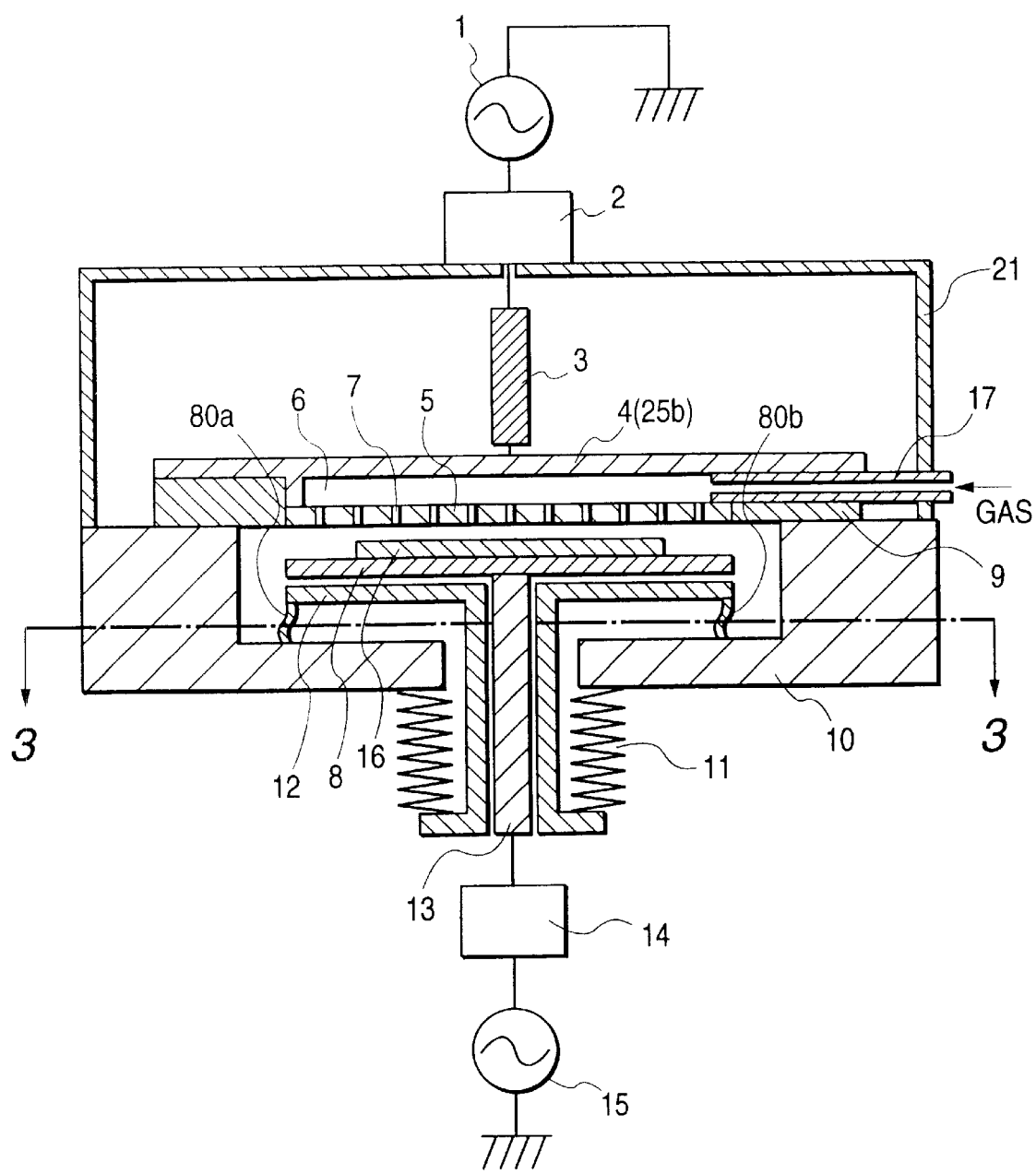
FIG. 1 is a cross sectional view of plasma treatment equipment in accordance with the first embodiment of the plasma treatment equipment.

FIG. 1 shows an embodiment of plasma treatment equipment in accordance with the present invention. In this plasma treatment equipment, metal plates 80a and 80b AC short between the chamber 10 and the shield 12 of the electrode having the same DC potential as that of the chamber.

Figure 2:
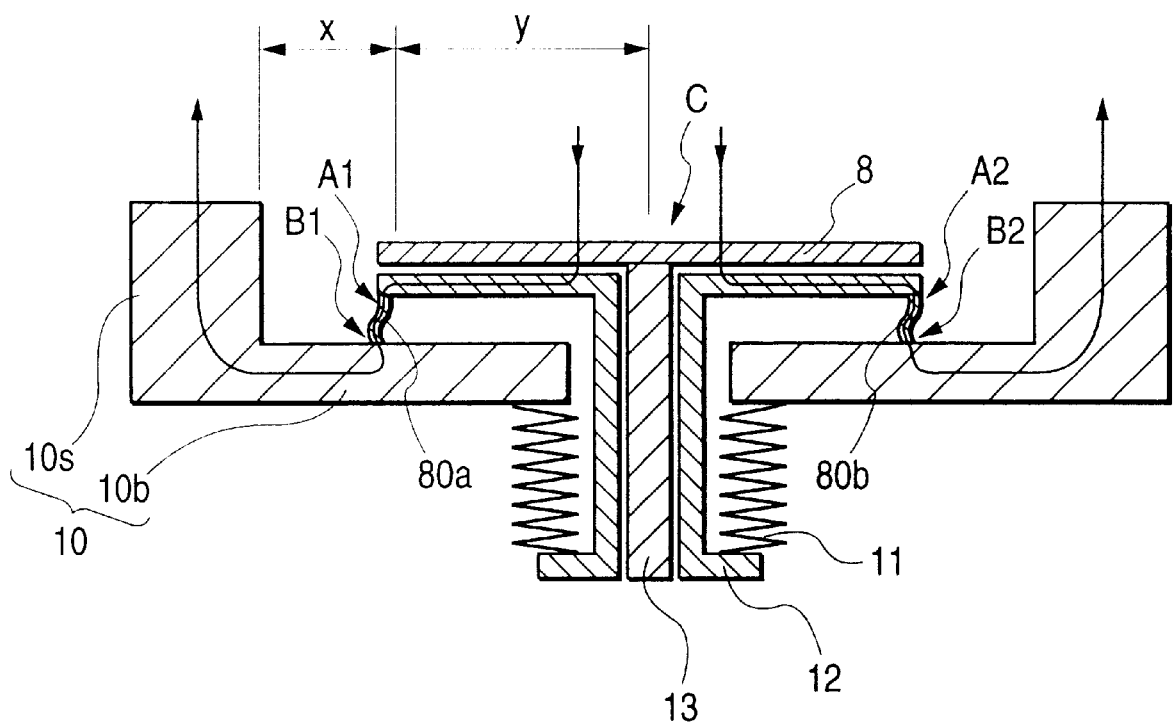
FIG. 2 is an enlarged view of the structure near a suscepter electrode.

FIG. 2 shows the detail of the wafer suscepter electrode 8 side.

In the present embodiment, the chamber 10 and the shield 12 are AC shorted at two locations. Both one ends of the respective metal plates 80a and 80b which are elastic springs are connected to the short points B1 and B2 on the bottom 10b of the chamber 10, and the other ends are both connected to the short points A1 and A2 on the shield 12 for shorting. The short points B1 and B2 are located near the outermost of the shield 12 so that the distance to the side wall 10s of the chamber wall 10 is set as short as possible. In other words, the short points B1 and B2 are set preferably at the nearest point to or near the nearest point to the side wall 10s of the chamber wall 10.

Inconel 625 (brand name) is preferably used as the material of the metal plate in the view point of reduced gas release in vacuum, and a metal plate of the size 20 mm×40 cm×0.3 mm is used in this embodiment.

Figure 3A:
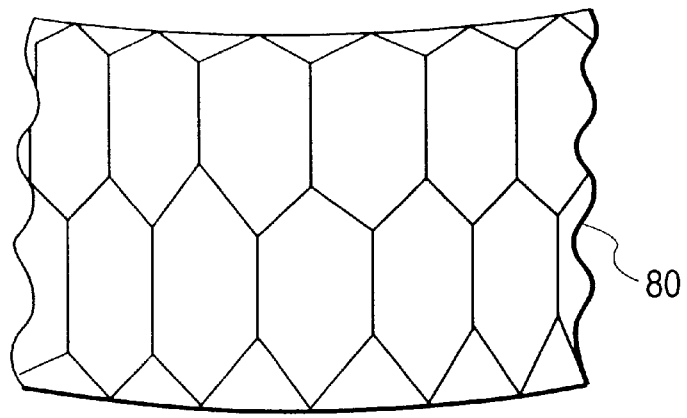
FIG. 3A is a partial side view of a mesh metal plate and FIG. 3B is a plan view of the mesh metal plate.
Figure 3B:
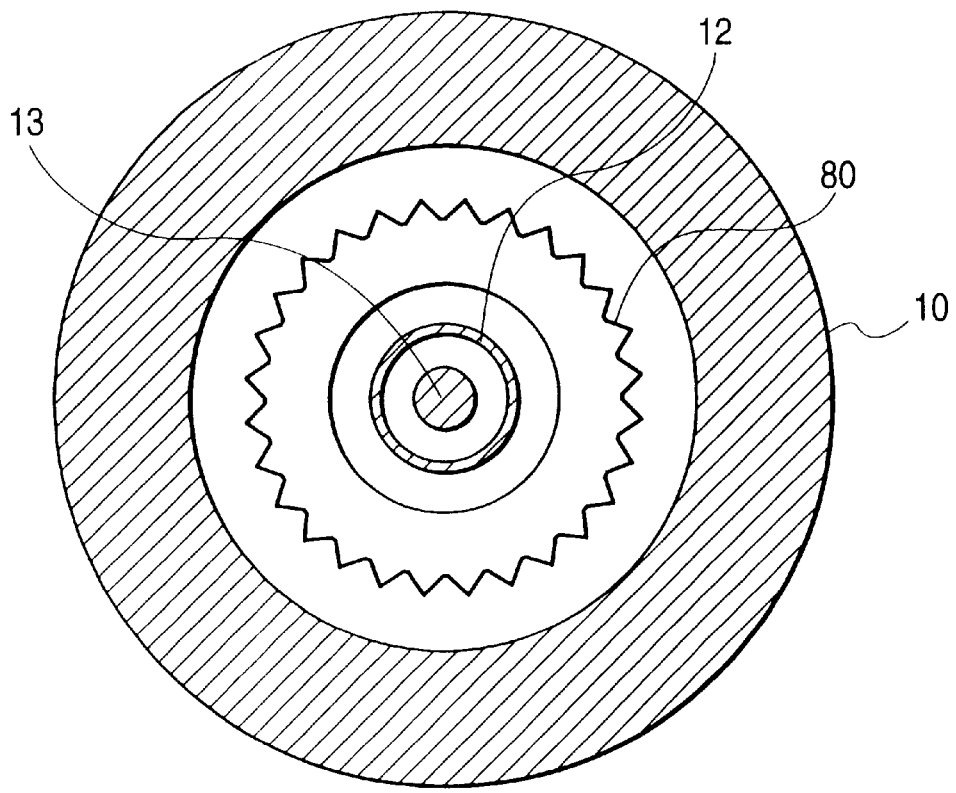

Though a plate form material is used in the present embodiment, a mesh form material may be used preferably. Turtle back form material and lattice from material as shown in FIG. 3A may be used preferably among mesh form materials. A cylindrical mesh form metal plate is preferably disposed along the periphery of the suscepter shield 12. FIG. 3B is a cross sectional view along the line 3—3 in FIG. 1, in which metal plates formed of turtle back form mesh are disposed instead of the metal plates 80a and 80b. Exhaustion of gas in the chamber is not disturbed and the flow of high frequency current is uniformed because the metal plate is mesh form. Furthermore the turtle back form mesh is elastic and easy to follow the vertical motion of the bellows.

In the present embodiment, the short points A1 and A2 on the shield 12 are set immediately above the short points B1 and B2.

In the plasma treatment equipment of the present embodiment, the high frequency power is supplied from the high frequency power source 1 to the coaxial cable, matching circuit, feeder plate 3, and plasma excitation electrode (cathode) 4. This plasma treatment equipment is the same as the conventional plasma treatment equipment in this point. On the other hand, in the case that the path of the high frequency current is addressed, a current passes the plasma space (chamber 60) through these components, and passes the other electrode (suscepter electrode) 8, the horizontal part of the shield 12, metal plates 80a and 80b, the bottom 10b of the chamber wall 10, and the side wall 10s of the chamber wall 10. Then the current passes the housing of the matching box 2, and returns to the earth of the high frequency power source 1.

In the conventional plasma treatment equipment, the high frequency current passes the vertical part of the shield 12. The increment of the size of the base plate 16 involves the increment of the distance between the shield 12 and the chamber wall. The mutual inductance caused from a high frequency current which is flowing in the shield 12 and the chamber side wall 10s increases as the distance between the shield 12 and the chamber side wall 10s increases. As a result the power consumption efficiency decreases. Therefore, the conventional plasma treatment equipment having a large sized base plate is haunted by low power consumption efficiency.

On the other hand, in the plasma treatment equipment in accordance with the present embodiment, because the high frequency current passes the metal plates 80a and 80b which are located nearer to the chamber wall 10s than the vertical part of the shield 12, the mutual inductance is significantly reduced and the power consumption efficiency is significantly increased.

Figure 12:
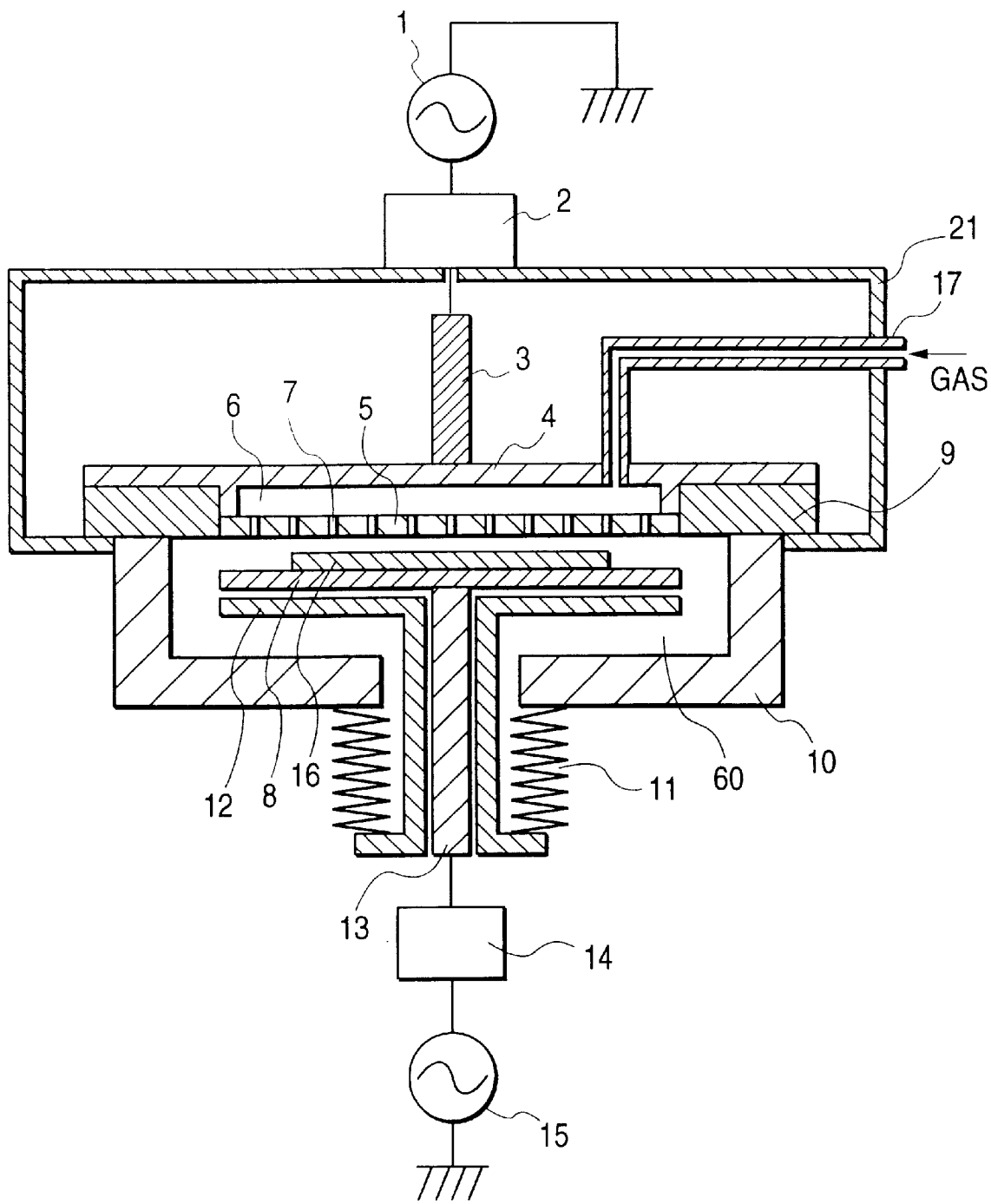
FIG. 12 is a cross sectional view of plasma treatment equipment in accordance with a conventional example.
Figure 13:
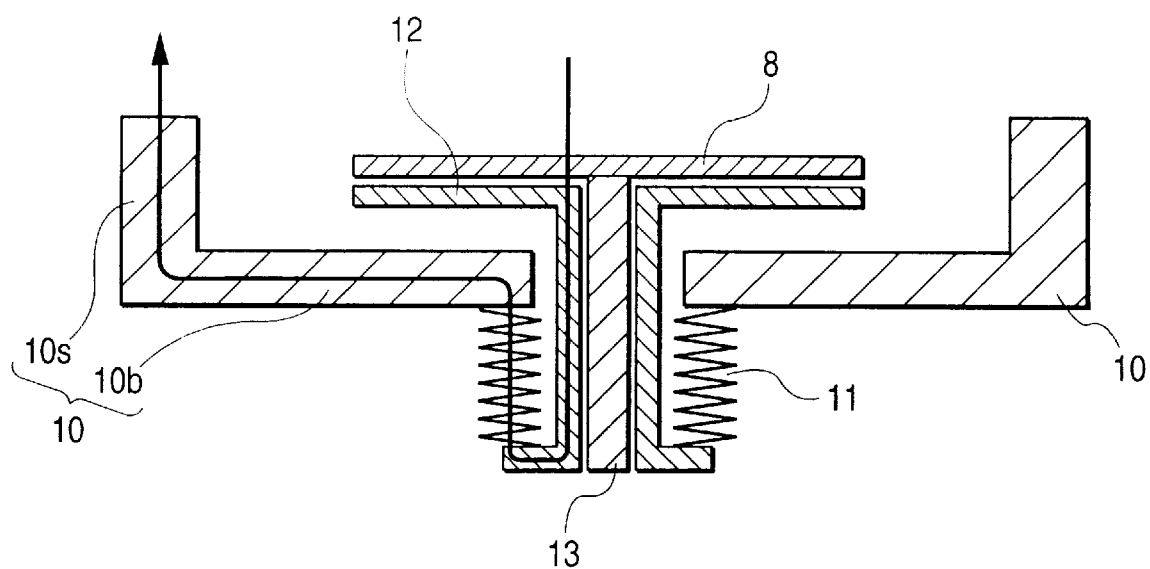
FIG. 13 is a partially enlarged view of the susceptor electrode and periphery thereof shown in FIG. 12.

An insulating film consisting of silicon nitride was formed by use of equipment shown in FIG. 1 and equipment shown in FIG. 12, and the power consumption efficiency was measured. As a result, the power consumption efficiency of the equipment shown in FIG. 1 was double that of the equipment shown in FIG. 12.

The suscepter impedance was measured. The results are shown in FIG. 4. FIG. 4A shows the result obtained by the plasma treatment equipment (conventional) shown in FIG. 12 and FIG. 4B shows the result obtained by the plasma treatment equipment shown in FIG. 1.

As shown in FIG. 4, the suscepter impedance of the plasma treatment equipment in accordance with the present embodiment is much smaller than that of the conventional plasma treatment equipment, and also the frequency dependency is small.

Second Embodiment of Plasma Treatment Equipment

Figure 5:
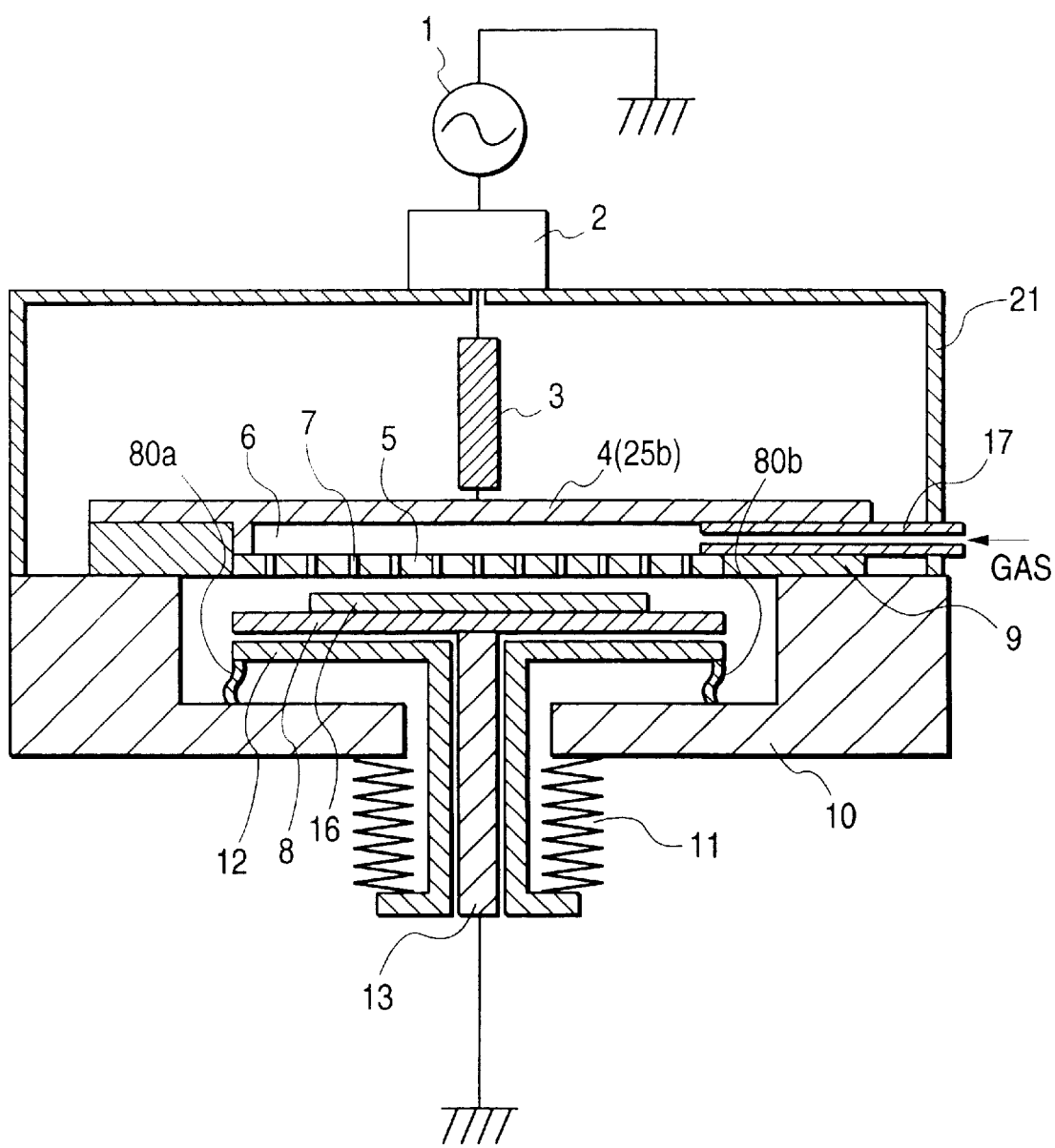
FIG. 5 is a cross sectional view of plasma treatment equipment in accordance with the second embodiment of the plasma treatment equipment.

FIG. 5 shows plasma treatment equipment in accordance with the second embodiment.

Figure 14:
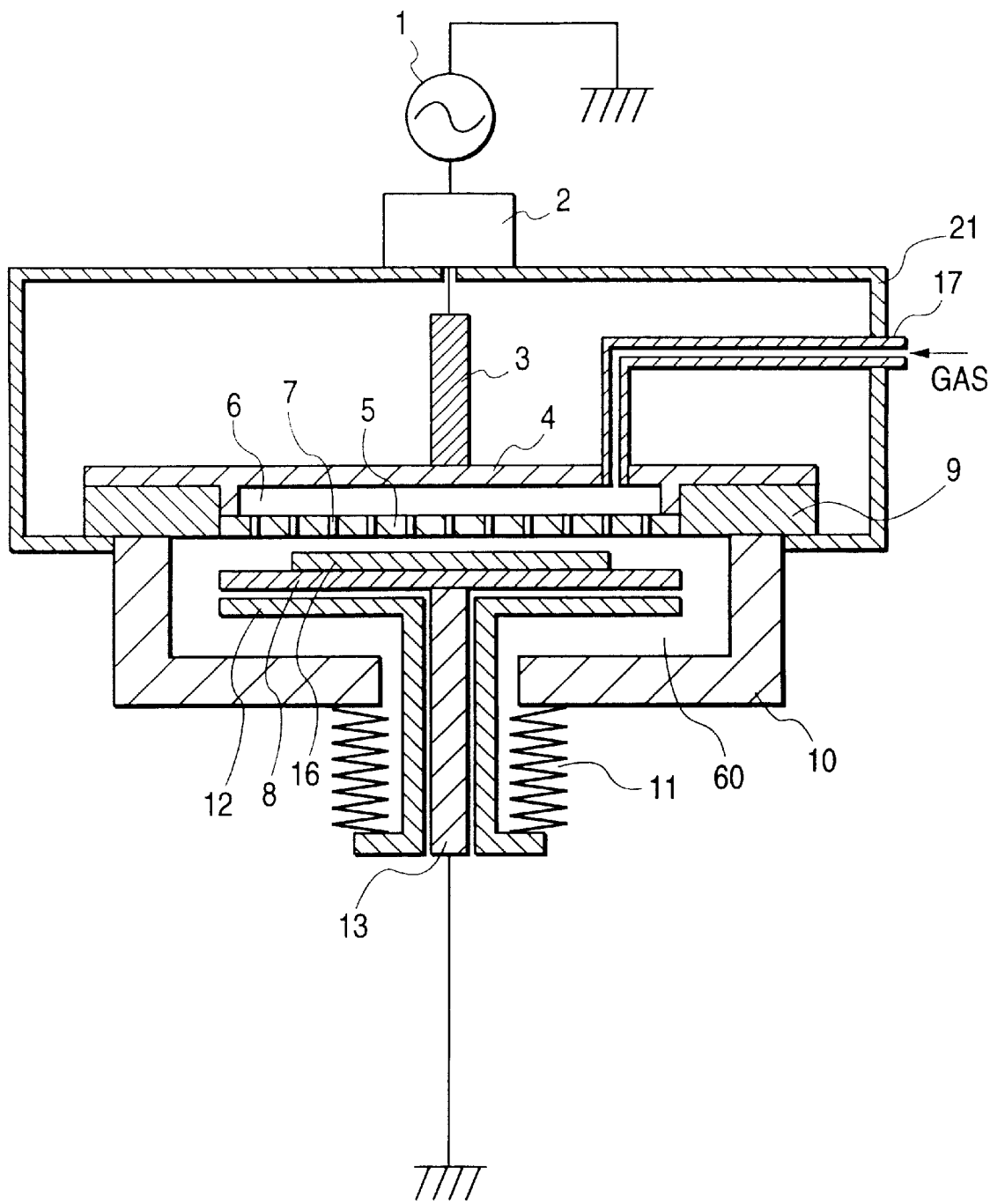
FIG. 14 is a cross sectional view of plasma treatment equipment in accordance with another conventional example.

The present embodiment is an example in which metal plates 80a and 80b are provided to the plasma treatment equipment shown in FIG. 14, namely, a single wave excitation type plasma treatment equipment.

In detail, the metal plates 80a and 80b AC short between the chamber wall 10 and the electrode (suscepter electrode) 8 having the same DC potential as the chamber. The present embodiment is the same as the first embodiment excepting the above-mentioned point.

Third Embodiment of Plasma Treatment Equipment

In the present example, the influence of the position where the metal plate is provided is studied.

In detail, in the equipment shown in FIGS. 1 and 2, the short points B1 and B2 of the metal plate on the chamber wall 10 are located immediately under the short points A1 and A2 of the metal plate on the shield 12, and the magnitude of the mutual inductance is measured by changing the distance x from the short point to the chamber side wall 10s.

Figure 6:
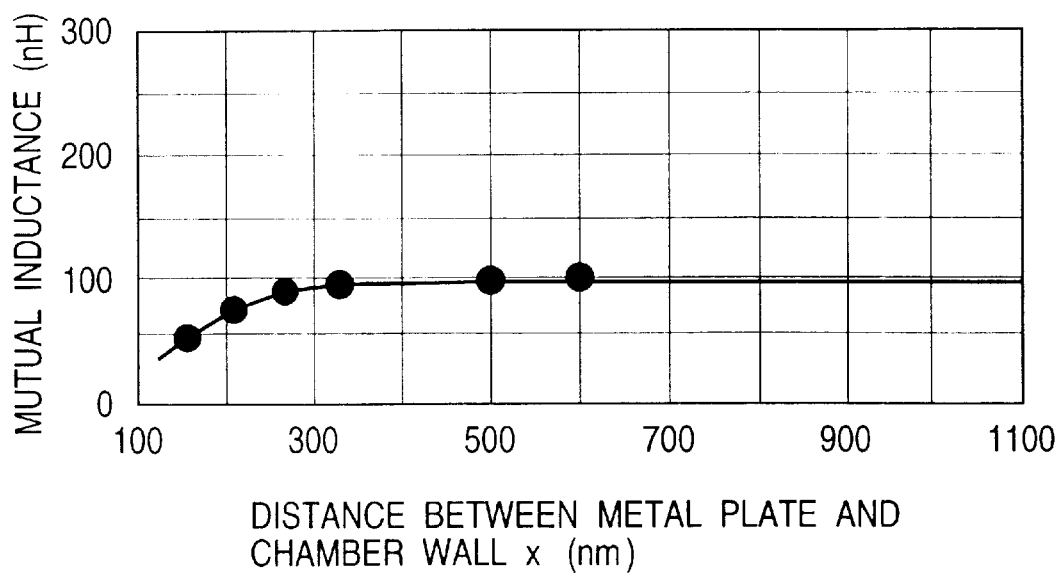
FIG. 6 is a graph for showing the relation between the distance from a metal plate to a chamber wall and the mutual inductance.

The result is shown in FIG. 6. As shown in FIG. 6, the inductance begins to decrease from the distance x of 500 mm with decreasing the distance x, the rate of reduction becomes large from around 350 mm, and the rate of reduction becomes larger from around 200 mm.

Accordingly, it is preferable that the distance between the short point and the chamber side wall is 500 mm or shorter, the distance of 350 mm or shorter is more preferable, and the distance of 200 mm or shorter is further more preferable. The most preferable distance is the shortest distance from the chamber side wall 10s or near the shortest distance.

Fourth Embodiment of Plasma Treatment Equipment

The influence of the number of metal plates to be provided is studied.

In detail, the magnitude of inductance is measured by changing the number of provided metal plates. Metal plates are disposed approximately in point symmetry with respect to the center of the shield.

Figure 7:
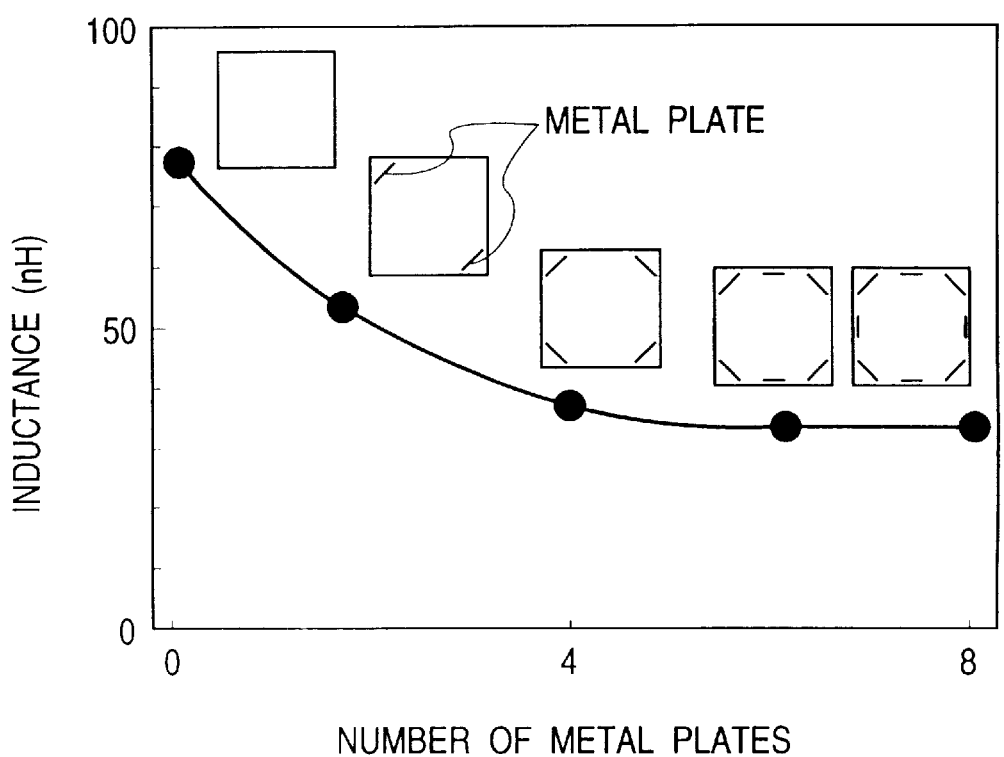
FIG. 7 is a graph for showing the influence of the number of provided metal plates.

The result is shown in FIG. 7.

As shown in FIG. 7, the inductance decreases with increasing the number of metal plates, however the rate of reduction is the same for both four metal plates and eight metal plates. In other words, the inductance reduction saturates at four metal plates. Accordingly, four metal plates are preferable. Addressing the fact that the path of high frequency current is uniform and the object to be treated which is placed on the center of the electrode is subjected to plasma treatment effect uniformly when the square electrode is used, four or eight metal plates are preferably provided.

Fifth Embodiment of Plasma Treatment Equipment

Figure 8:
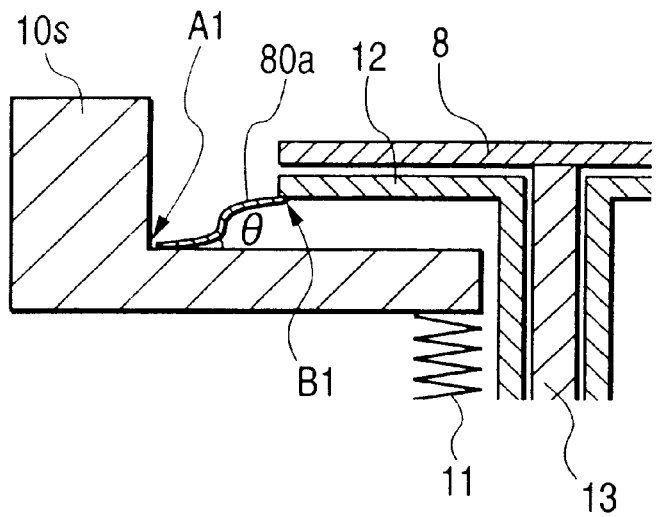
FIG. 8 is a cross sectional view for showing a part of plasma treatment equipment in accordance with the fifth embodiment of the plasma treatment equipment.

The fifth embodiment is shown in FIG. 8.

The present example is an example in which a metal plate 80a is provided inclined. In detail, one end of the metal plate 80a is shorted at the point B1 on the shield 12 located nearest to the chamber side wall, and the other end of the metal plate 80a is shorted at the point A1 on the chamber side wall not immediately under B1, as the result the metal plate is disposed inclined. In the case that a metal plate 80a is disposed inclined, the inclination angle θ is preferably smaller than 45 degrees to suppress the mutual inductance low.

The power consumption efficiency of the fifth embodiment is higher than that of the first embodiment.

Sixth Embodiment of Plasma Treatment Equipment

Figure 9:
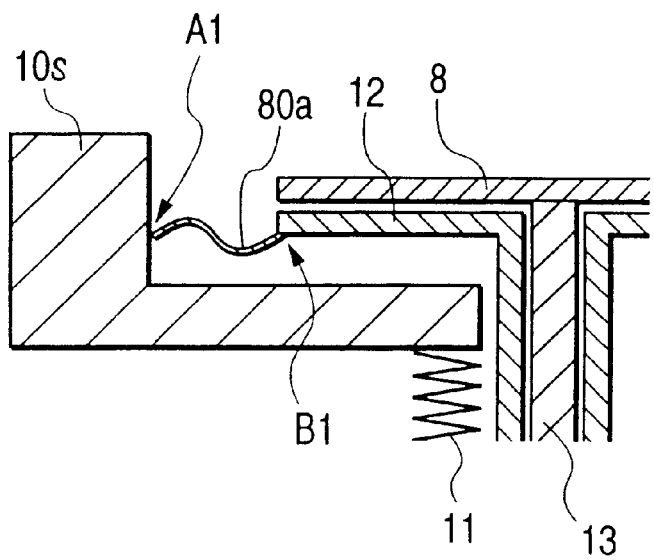
FIG. 9 is a cross sectional view for showing a part of plasma treatment equipment in accordance with the sixth embodiment of the plasma treatment equipment.

FIG. 9 shows the sixth embodiment.

In the present example, the metal plate 80a is disposed approximately perpendicular to the chamber side wall 10s, in other words, disposed approximately horizontal to the suscepter electrode 8.

The power consumption efficiency is higher than that of the fifth embodiment.

Seventh Embodiment of Plasma Treatment Equipment

Figure 10:
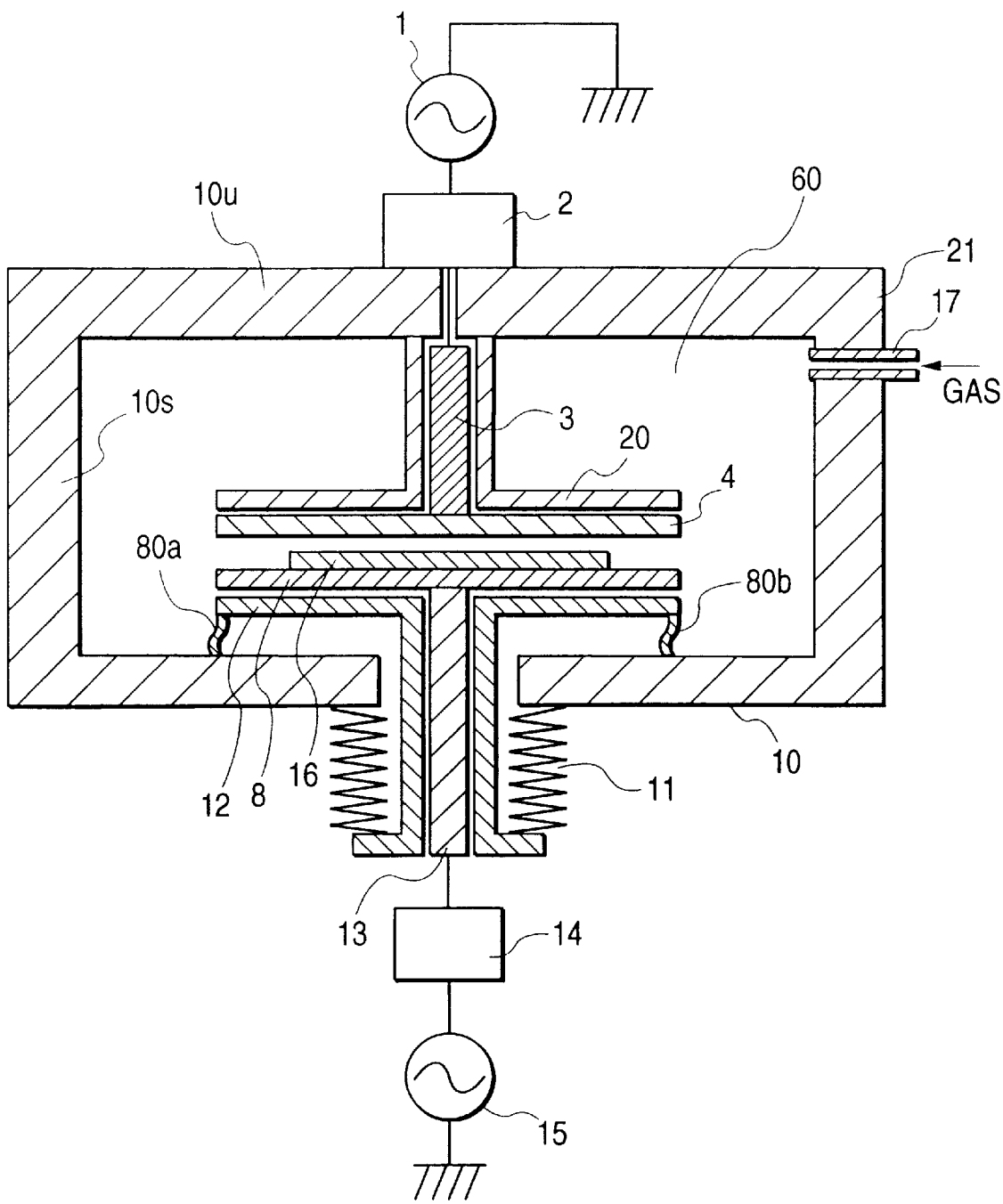
FIG. 10 is a cross sectional view of plasma treatment equipment in accordance with the seventh embodiment of the plasma treatment equipment.

FIG. 10 shows the seventh embodiment.

Figure 15:
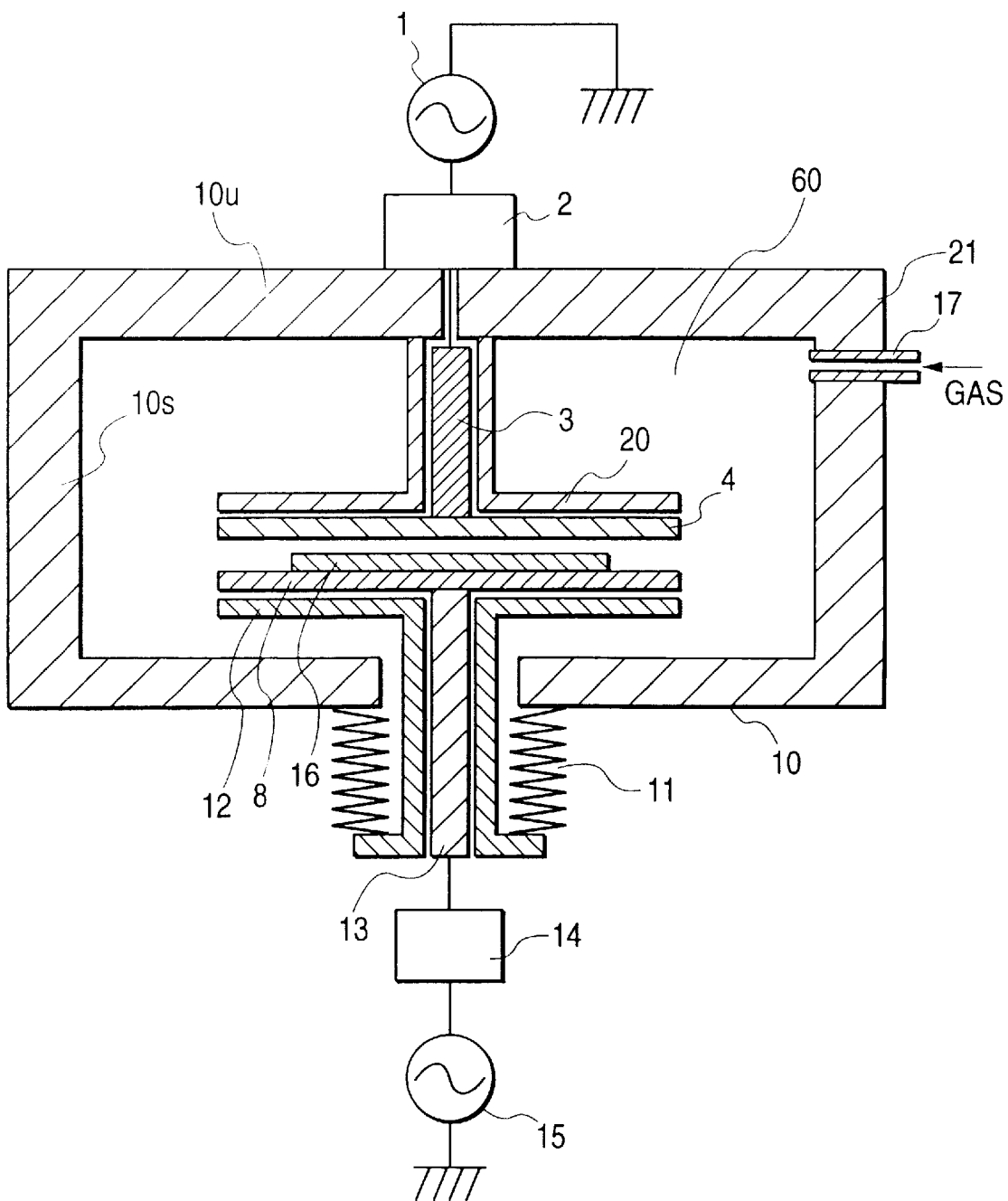
FIG. 15 is a cross sectional view of plasma treatment equipment in accordance with another conventional example.

The present example is an example in which a metal plate is provided in the conventional plasma treatment equipment shown in FIG. 15.

The present embodiment is the same as that of the first embodiment excepting the above-mentioned point. The plasma treatment equipment in accordance with the present example is superior in power consumption efficiency, film forming speed, and dielectric strength to the conventional plasma treatment equipment shown in FIG. 15.

Eighth embodiment of Plasma Treatment Equipment

Figure 11:
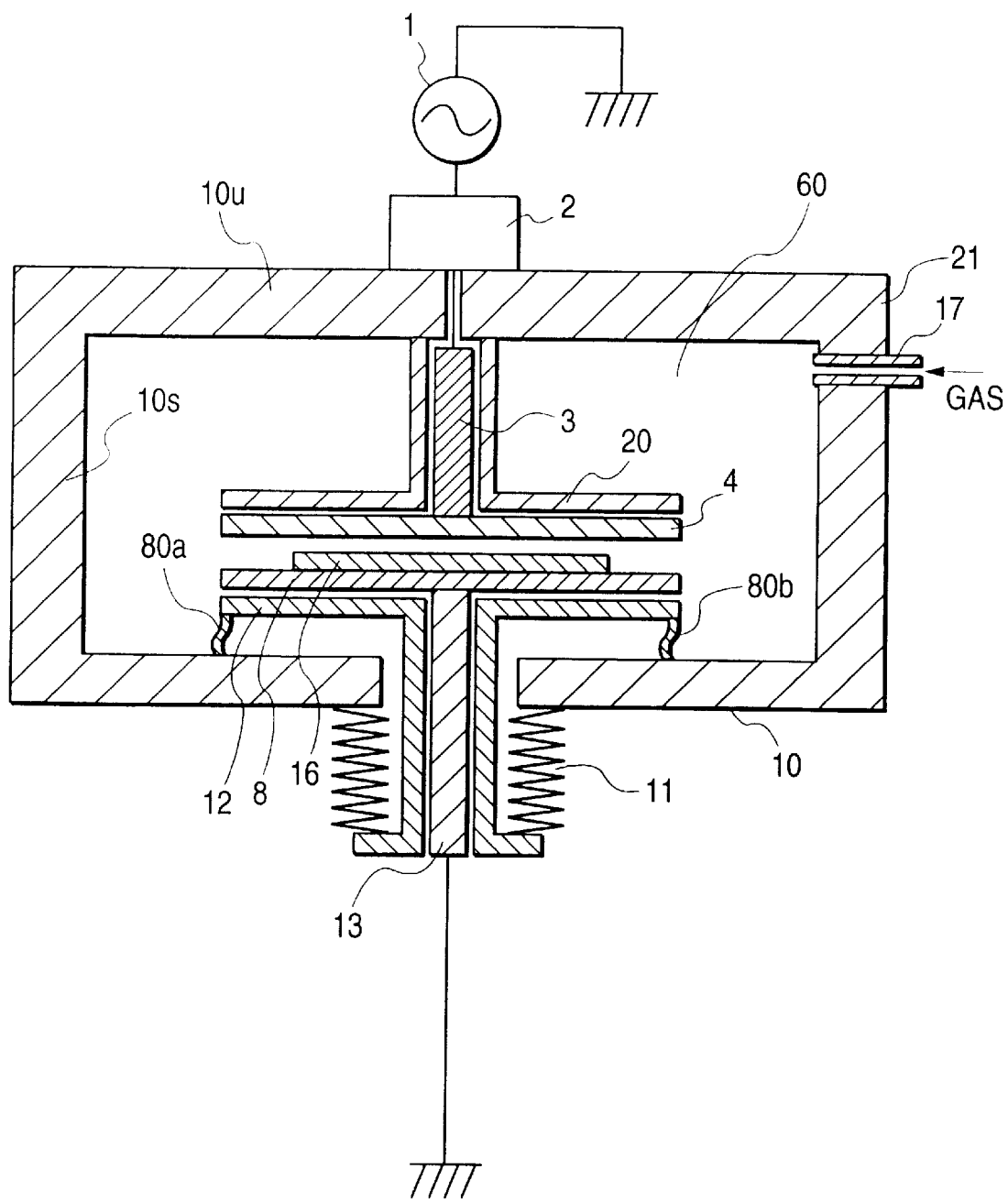
FIG. 11 is a cross sectional view for showing plasma treatment equipment in accordance with the eighth embodiment of the plasma treatment equipment.

FIG. 11 shows the eighth embodiment.

Figure 16:
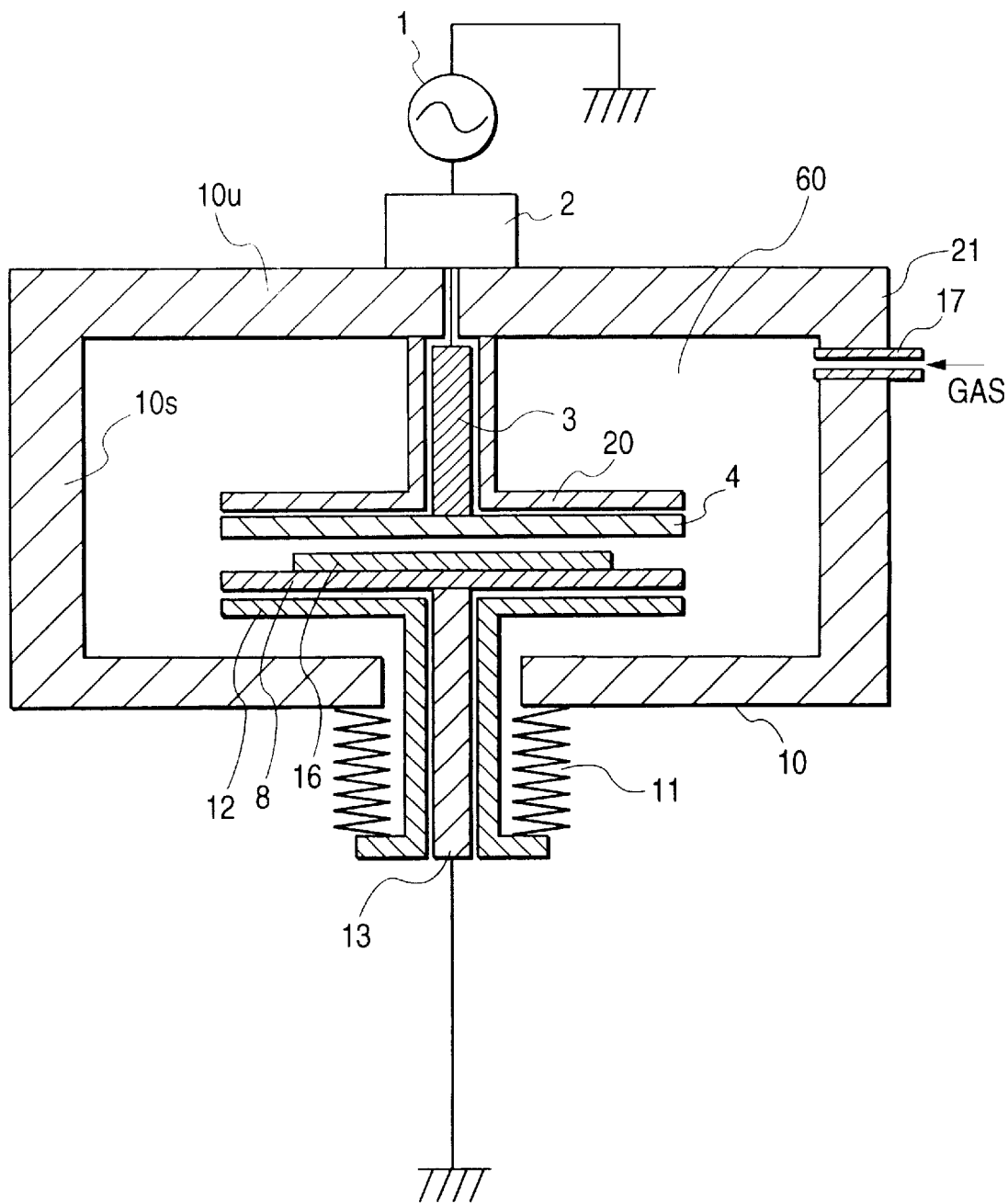
FIG. 16 is a cross sectional view of plasma treatment equipment in accordance with another conventional example.

The present example is an example in which a metal plate is provided in the conventional plasma treatment equipment shown in FIG. 16.

The present embodiment is the same as the first embodiment excepting the above-mentioned point.

The plasma treatment equipment in accordance with the present example is superior in power consumption efficiency, film forming speed, and dielectric strength to the conventional plasma treatment equipment shown in FIG. 16.

In the invention described herein above, it is possible to improve the power consumption efficiency to the higher level in comparison with the conventional plasma treatment equipment by reducing the impedance.

However the desired power consumption efficiency level is not achieved yet.

The inventors of the present invention studied the cause, and concluded that the cause was attributed to the impedance of the high frequency power source 1 and the impedance of the matching circuit.

In detail, the base plate size has been smaller than 80 cm, the plasma density has been not high, and the used frequency has been 13.56 MHz in the conventional plasma treatment equipment, as the result, the impedance of the high frequency power source and the impedance of the matching circuit have not influenced the power consumption efficiency. However, the inventors of the present invention have concluded that the impedance of the high frequency power source and the impedance of the matching circuit can not be negligible in the situation that the high plasma density is used, the large sized base plate is used, and the frequency higher than 13.56 MHz is used. The resistance value of the conventional high frequency power source is 50 Ω.

A test was conducted based on this idea. As the result, it was found that the power consumption efficiency was improved when the resistance value of the high frequency power source was smaller than 50 Ω and the resistance value of the matching circuit was smaller than 50 Ω in the case that the frequency higher than 13.56 MHz was used. Particularly, 10 Ω or smaller is more preferable.

The fixture (testing tool) is used for the impedance measurement tool and the impedance measurement method of a plasma equipment used for manufacturing semiconductors, LCD, and MR heads.

Prior art of the fixture is described herein under.

A plasma equipment for generating plasma by means of glow discharging using a high frequency power source has been used in film forming process and etching process. In such process, impedance which is parasitic in the equipment results in reduced effective power ratio, which indicates the ratio of the power effectively used in plasma space to the supplied power, and the reduced power ratio adversely affects the film forming speed and the dielectric strength of film and causes reduced productivity and deteriorated film quality. To improve these disadvantages, it is necessary to measure the impedance which is parasitic in the equipment quantitatively.

To measure the impedance which is parasitic in the equipment, an impedance analyzer having coaxial probe or an network analyzer has been used. However, the measurable size of an object to be measured or the measurable length between two points is limited because of the configuration of the probe.

Heretofore, to solve this problem, a method in which a lead wire having a length corresponding to the size of an object to be measured or the length between two point attached to the earth side of the probe is used as a fixture and the residual impedance is corrected has been known as the most simple method.

However, the above-mentioned conventional fixture is involved in a problem as described herein under.

(1) Because a current flows asymmetrically through an object to be measured, the impedance of the object to be measured is measured only partially and the correct impedance is not measured.

(2) Because the current is restricted by the impedance of an earth wire attached as a fixture, the low impedance is measured not correctly.

The inventors of the present invention invented a novel impedance measurement tool which can measure the impedance without restriction on the size of an object to be measured or the length between two points and with a current flowing uniformly through the object to be measured, and which can be designed so that the residual impedance value does not affect the measurement of the impedance of the object to be measured.

First Embodiment of Impedance Measurement Tool

Figure 17:
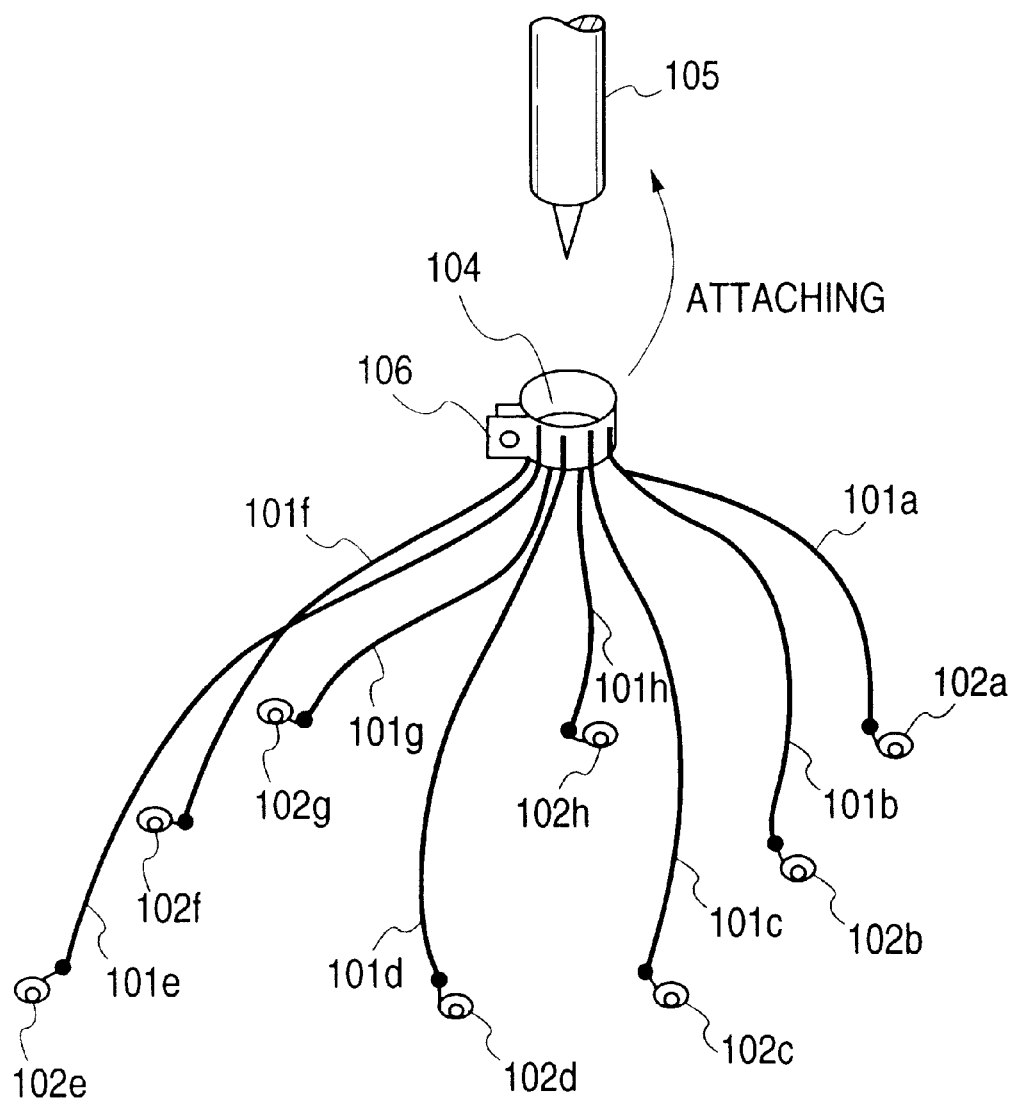
FIG. 17 is a diagram for showing the first embodiment in accordance with the impedance measurement tool of the present invention.

The first embodiment of an impedance measurement tool in accordance with the present invention is described with reference to FIG. 17. This fixture is provided with a plurality of lead wires 101a to 101h of the same impedance having respective one ends connected to the probe attachment 104.

The probe attachment 104 is formed of, for example, a copper plate having a size of 50 mm×10 mm×0.5 mm so as to have a clamp 106 and a ring. The diameter of the ring is formed so as to fit on the outside of the probe 105.

The one ends of the lead wires 101a to 101h are connected electrically to the probe attachment 104 by soldering or the like.

Detachable terminal (crimp-style terminal) 102a to 102h are attached on the other ends of the lead wires 101a to 101h for attaching to the object to be measured.

Figure 21:
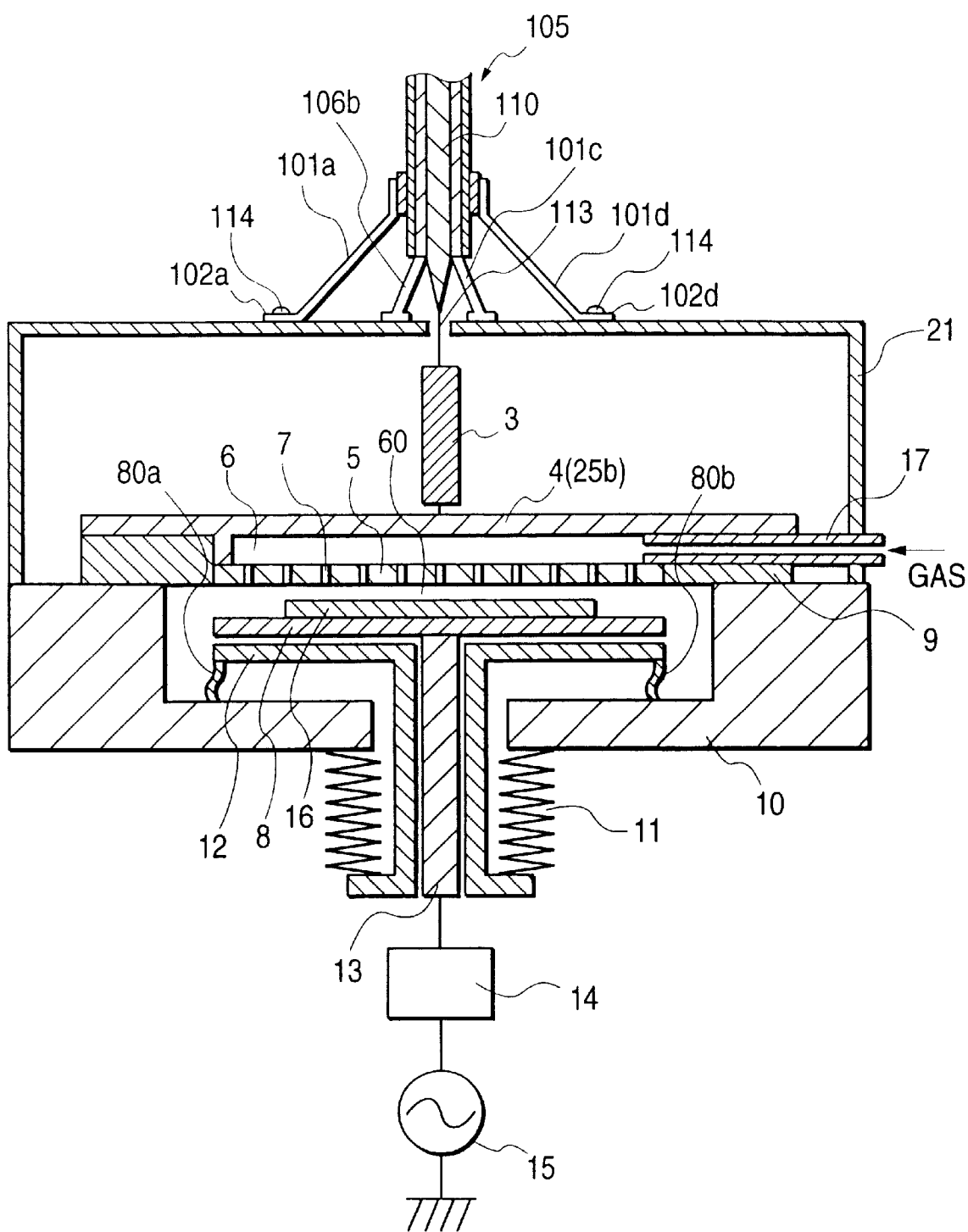
FIG. 21 is a diagram for describing a method for measuring the impedance of the plasma treatment equipment shown in FIG. 1 by use of the impedance measurement tool shown in FIG. 17.
Figure 23:
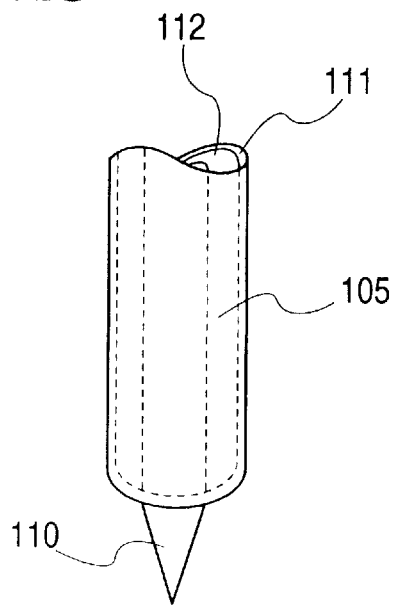
FIG. 23 is a perspective view for showing the probe used for the impedance measurement tool shown in FIG. 17, FIG. 18, and FIG. 22.

When this fixture is used, the probe 105 is inserted into the ring 104 of the probe attachment 104 and the clamp 106 is tightened. The respective crimp-style terminals 102a to 102h of the lead wires 101a to 101h are screwed with screws 114 detachably on the object to be measured so as to be symmetric as shown in FIG. 21. The probe 105 comprises a lead wire 110, an insulating sheath 112 provided outside the lead wire 110, and a peripheral conductor 111 provided on the insulating sheath 112 (see FIG. 23). The probe 105 is connected to an impedance measurement tool not shown in the drawing through a coaxial cable.

The lead wires 101a to 101h consist of, for example, aluminum, copper, silver, or gold, otherwise may comprise plated layers having a thickness of 50 μm or thicker consisting of silver or gold.

Figure 19A:
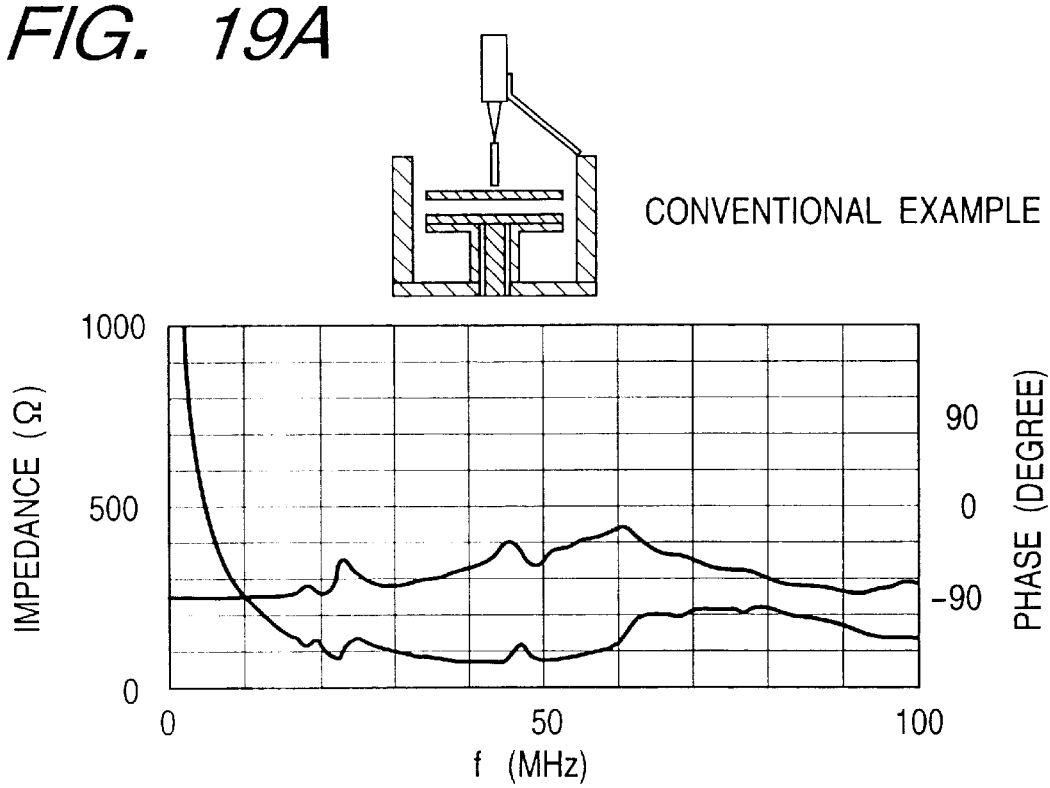
FIGS. 19A and 19B are graphs for showing the result measured by use of the impedance measurement tool shown in FIG. 17 and a conventional example.
Figure 19B:
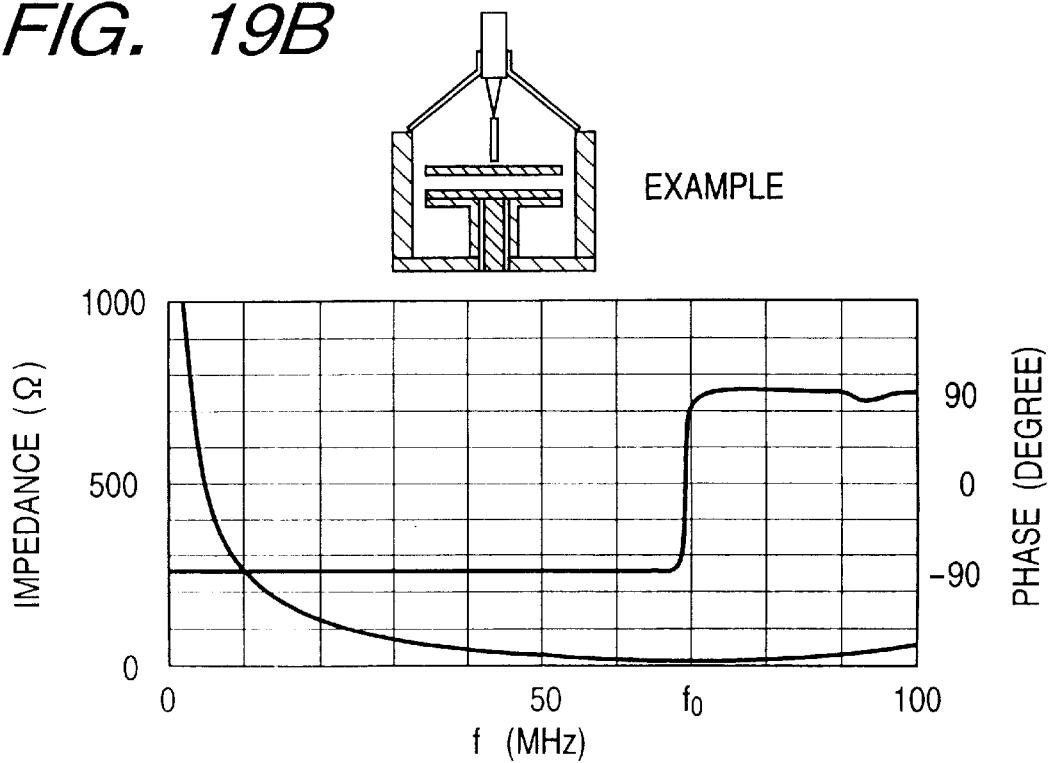

The fixture is arranged as described herein above, and the impedance of the object to be measured is measured. The result is shown in FIG. 19. FIG. 19A shows the result of the conventional example, and FIG. 19B shows the result of the present example. In the conventional example shown in FIG. 19A is measured by use of the probe 105 shown in FIG. 23.

The impedance Z is represented by $\omega L - 1/\omega C$, a hyperbola represented by $1/\omega C$ and a straight line represented by $\omega L$ form an inflection point at a certain frequency $f_0$, and the phase changes at this inflection point. However, the inflection point is not clear in FIG. 19A which shows the result of the conventional example.

On the other hand, in FIG. 19B which shows the result of the present example, the hyperbola, straight line, and inflection point are clear at the frequency $f_0$, it is obvious that the impedance is measured correctly.

It is desirable to use copper lead wires 101a to 101h because of low specific resistivity to reduce the restriction on the current due to impedance of the lead wires 101a to 101h. The use of copper wire is advantageous also in that the parasitic capacitance between an object to be measure and the lead wires can be reduced.

Next, a method for measuring the impedance of the path of the plasma treatment equipment shown in FIG. 1 from the feeder plate 3, to plasma excitation electrode (cathode) 4, plasma space 60, suscepter electrode 8, horizontal part of the shield 12, metal plates 80a and 80b, bottom 10b of the chamber wall 10, side wall 10s of the chamber wall 10, and housing 21 by use of the impedance measurement tool described in the present embodiment is described with reference to FIG. 21.

First, the high frequency power source 1 and the matching box 2 of the plasma treatment equipment is taken out from the plasma treatment equipment. The lead wire 110 of the probe 105 of the impedance measurement tool is connected to the lead wire 113 which connects between the matching box 2 and the feeder plate 3. Next, the crimp-style terminals 102a to 102h connected to the lead wires 101a to 101h of the impedance measurement tool are screwed with screws 114 on the housing 21 of the plasma treatment equipment so as to be approximately point symmetrical with respect to the center of the feeder plate 3. After the impedance measurement tool is arranged as described herein above, a measurement signal is supplied to the lead wire 110, and the impedance of the path from the feeder plate 3 of the plasma treatment equipment to the housing 21 through the plasma space 60 is measured.

For measurement, the fixture is attached to the measurement probe which has been calibrated at 0 S, 0 Ω, and 50 Ω, at that time the influence of the residual impedance of the fixture can be solved by open and short correction. The same effect is obtained by calibration of the probe having the attached fixture as shown in FIG. 20.

Second Embodiment of Impedance Measurement Tool

Figure 18:
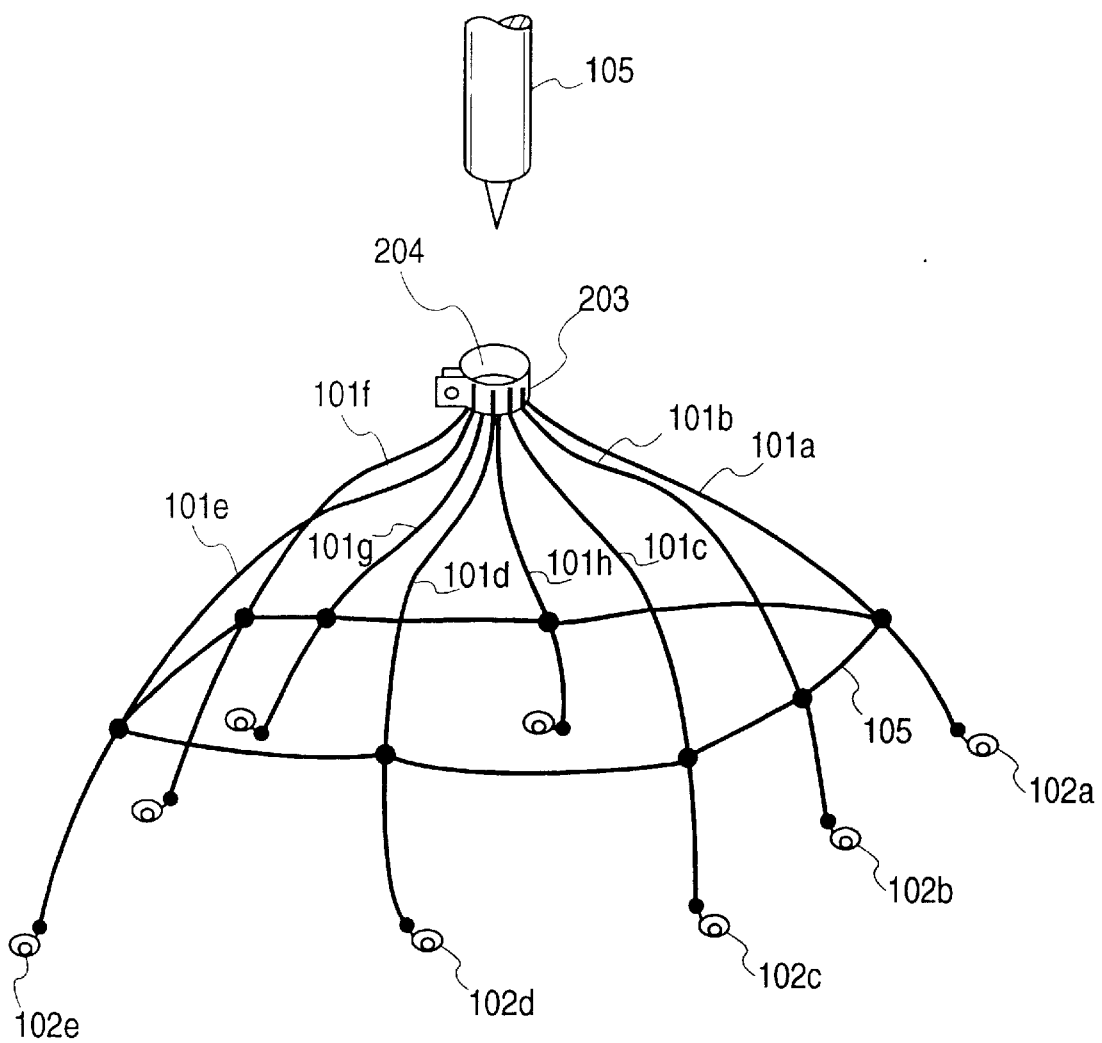
FIG. 18 is a diagram for showing the second embodiment in accordance with the impedance measurement tool of the present invention.

The second embodiment of an impedance measurement tool in accordance with the present invention is described with reference to FIG. 18. This impedance measurement tool is used for measuring a large sized object to be measured, in this case a shorting lead wire 105 is provided to short between a plurality of lead wires 101a to 101h.

The impedance of the testing tool can be reduced by use of this impedance measurement tool because the path of measurement current increases. As the result, the proportion of the impedance of the object to be measured to the impedance of the whole measurement system including the object to be measured becomes high, and the impedance is measured at higher accuracy.

Third Embodiment of Impedance Measurement Tool

Figure 22:
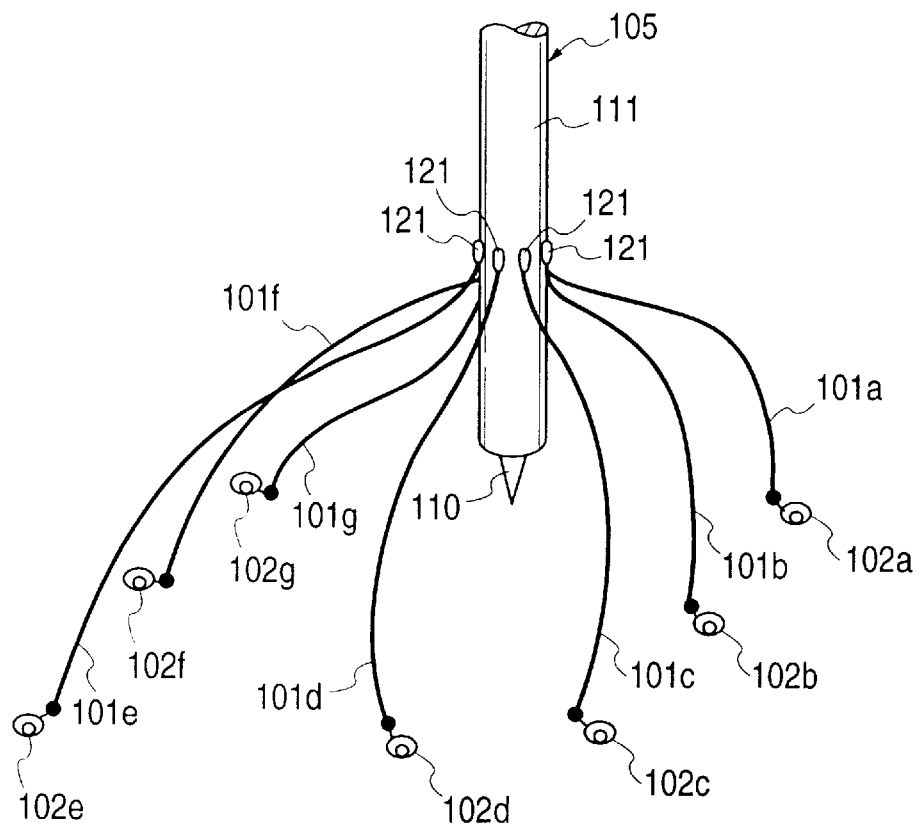
FIG. 22 is a perspective view for showing the third embodiment in accordance with the impedance measurement tool of the present invention.

The third embodiment of an impedance measurement tool of the present invention is shown in FIG. 22. This embodiment is different from the first embodiment in that one ends of a plurality of lead wires 101a to 101h described in the above-mentioned first embodiment are connected by soldering directly to soldering terminals 121 on the peripheral conductor 111 of the probe 105 without the probe attachment, and other structures are the same as those of the above-mentioned first embodiment. The same effect as obtained by use of the impedance measurement tool of the present invention in accordance with the first embodiment is obtained by applying this embodiment.

According to the present invention, the power consumption efficiency is improved, the film forming speed is faster, and the better film quality is realized. Furthermore, the suscepter impedance is reduced and the frequency dependency is reduced.

What is claimed is:

1. Plasma treatment equipment in which a chamber wall and a susceptor electrode having the same DC potential are AC shorted to each other.

2. The plasma treatment equipment according to claim 1, wherein said chamber wall and said susceptor electrode are shorted to each other at a location that is within a distance shorter than 500 mm from a side wall of the chamber wall.

3. The plasma treatment equipment according to claim 1, wherein said susceptor electrode is shorted to said chamber wall at a short point on a bottom wall of the chamber wall, said short point being located within a distance shorter than 500 mm from a side wall of the chamber wall as measured along the bottom wall.

4. The plasma treatment equipment according to claim 3, wherein said susceptor electrode is shorted to said chamber wall by a metal plate, said metal plate being connected between the short point on the bottom wall and a second short point on a shield of the susceptor electrode.

5. The plasma treatment equipment according to claim 3, wherein the said metal plate is inclined with respect to the bottom wall, and an angle formed between said metal plate and the bottom wall is less than 45 degrees.

6. The plasma treatment equipment according to claim 1, wherein said chamber wall and said susceptor electrode are shorted at a plurality of short points.

7. The plasma treatment equipment according to claim 6, wherein the plurality of short points are disposed approximately symmetrically with respect to a center of said susceptor electrode.

8. The plasma treatment equipment according to claim 6, wherein the plurality of short points are disposed approximately symmetrically with respect to a center of a shield of said susceptor electrode.

9. The plasma treatment equipment according to claim 1, wherein said susceptor electrode comprises a shield having the same DC potential as said chamber wall, and said shield and said chamber wall are AC shorted to each other.

10. The plasma treatment equipment according to claim 1, wherein said susceptor electrode is shorted to a side wall of the chamber wall.

11. Plasma treatment equipment comprising:
a plasma chamber having a bottom wall and a side wall; and
a susceptor electrode disposed within the plasma chamber, said susceptor electrode comprising a generally planar shaped electrode portion oriented substantially parallel to the bottom wall of the plasma chamber, said susceptor electrode further comprising a generally planar shaped shield disposed adjacent to said electrode portion, said shield being located between said electrode portion and the bottom wall of the plasma chamber, wherein the bottom wall of the plasma chamber and the shield of the susceptor electrode have the same DC potential, wherein the bottom wall of the plasma chamber and the shield of the susceptor electrode are AC shorted to each other by a metal plate, said metal plate having a first end connected to a first short point on the shield and a second end connected to a second short point on the bottom wall of the chamber, and wherein the second short point is located within 500 mm of the side wall of the plasma chamber.

12. Plasma treatment equipment comprising:

a plasma chamber having a bottom wall and a side wall; and a susceptor electrode disposed within the plasma chamber, said susceptor electrode comprising a generally planar shaped electrode portion oriented substantially parallel to the bottom wall of the plasma chamber, said susceptor electrode further comprising a generally planar shaped shield disposed adjacent to said electrode portion, said shield being located between said electrode portion and the bottom wall of the plasma chamber, wherein the side wall of the plasma chamber and the shield of the susceptor electrode have the same DC potential, and wherein the side wall of the plasma chamber and the shield of the susceptor electrode are AC shorted to each other by a metal plate, said metal plate having a first end connected to a first short point on the shield and a second end connected to a second short point on the side wall of the chamber.

* * * * *

UNITED STATES PATENT AND TRADEMARK OFFICE
CERTIFICATE OF CORRECTION

PATENT NO. : 6,349,670 B1
DATED : February 26, 2002
INVENTOR(S) : Akira Nakano et al.

It is certified that error appears in the above-identified patent and that said Letters Patent is hereby corrected as shown below:

<u>Column 12,</u>
Line 34, delete "claim 3" and substitute -- claim 4 -- in its place.

Signed and Sealed this

Twenty-fourth Day of September, 2002

Attest:

JAMES E. ROGAN
Attesting Officer     Director of the United States Patent and Trademark Office